United States Patent

Hu et al.

[11] Patent Number: 5,096,857
[45] Date of Patent: Mar. 17, 1992

[54] CHEMICALLY STABILIZED CRISTOBALITE

[75] Inventors: Yung-Haw Hu, Wilmington, Del.; Michael A. Saltzeberg, Glen Mills, Pa.

[73] Assignee: E. I. Du Pont de Nemours and Company, Wilmington, Del.

[21] Appl. No.: 606,079

[22] Filed: Oct. 22, 1990

[51] Int. Cl.$^5$ ............................ C03C 8/02; C03C 8/16
[52] U.S. Cl. .................................. 501/21; 501/20; 501/54; 501/69; 501/70
[58] Field of Search ................. 501/21, 20, 54, 69, 501/70, 17

[56] References Cited

U.S. PATENT DOCUMENTS

| | | | |
|---|---|---|---|
| 2,252,466 | 8/1941 | Hanlein | 501/54 |
| 2,255,558 | 9/1941 | Dalton | 501/54 |
| 3,445,252 | 5/1969 | MacDowell | 106/39 |
| 3,951,670 | 4/1976 | Bush | 501/62 |
| 4,073,655 | 2/1978 | Li | 501/69 |
| 4,180,618 | 12/1979 | Alpha et al. | 501/70 |
| 4,395,388 | 7/1983 | Kaduk | 423/338 |
| 4,806,334 | 2/1989 | Fujinaka et al. | 501/21 |
| 4,818,729 | 4/1989 | Perotta et al. | 501/133 |
| 4,961,998 | 10/1990 | Senkalski et al. | 501/20 |

*Primary Examiner*—William R. Dixon, Jr.
*Assistant Examiner*—Sue Hollenbeck

[57] ABSTRACT

A crystalline composition having an X-ray diffraction pattern essentially the same as the high cristobalite form of silica comprising $SiO_2$, $Al_2O_3$ and a metal oxide ($Me_xO$) in which Me is selected from Na, Ca, Sr and mixtures thereof.

6 Claims, No Drawings

5,096,857

CHEMICALLY STABILIZED CRISTOBALITE

FIELD OF INVENTION

The invention is directed to chemically stabilized cristobalite. More particularly, the invention is directed to stabilized cristobalite compositions derived from the $CaO\text{—}Al_2O_3\text{—}SiO_2$, $SrO\text{—}Al_2O_3\text{—}SiO_2$ and $Na_2O\text{—}Al_2O_3\text{—}SiO_2$ systems.

BACKGROUND OF THE INVENTION

It is well known that circuit packaging can strongly influence the properties of integrated circuits (ICs). Lowering the dielectric constant (K) of the substrate materials in ICs increases signal propagation velocity, reduces power consumption and minimizes electronic cross-talk, thus allowing for higher functional density. Polymeric materials typically offer lower dielectric constants than ceramic materials, but for many applications the reliability, thermal stability, and superior thermal conductivity of ceramic packages make them more desirable. The low-K ceramic dielectrics currently in use are predominantly filled glass systems in which the glass is typically a borosilicate or aluminosilicate composition and the fillers are typically crystalline silicates. One important function of these fillers is to improve the thermal coefficient of expansion (TCE) matching of the dielectric to the other components of the circuits. The TCE of the dielectric is normally matched either to that of alumina ($\approx 6.2$ ppm/°C.) or silicon ($\approx 3.5$ ppm/°C.).

Often, the glasses used in circuit packaging have TCEs less than those required to match the TCE of the substrate or of the other components in the circuit. In these instances, the filler materials should have TCEs greater than about 4–6 ppm/°C., preferably in the range of about 6–12 ppm/°C., so that the composite TCE of the dielectric can be matched to the substrate and/or other components. Fillers used in composite packaging systems should also have low dielectric constant, good chemical compatibility and should sinter to dense bodies in combination with the glasses of interest.

For low dielectric constant applications, quartz is the most commonly used high-TCE filler. Quartz has a desirably low dielectric constant (about 4–4.5), a TCE of about 10–12 ppm/°C. in the temperature range 25°–300° C., and excellent chemical durability. However, quartz undergoes a displacive alpha-to-beta phase transition at 573° C., which is accompanied by a relatively large volume change. It is wellknown that this abrupt volume change can cause mechanical instabilities (cracking, crazing, etc.) to develop in multilayer systems upon thermal cycling through the phase transition. Although the use temperature of the package does not normally exceed 150°–250°C., a large number of re-firings at 850°–950° C. are typically necessary to fabricate a ceramic multilayer electronic package, so the alpha-to-beta phase transition is a disadvantage is quartz-filled systems. Quartz is also not wet well by many glasses used in low-K dielectrics, so the sintering properties of quartz often limit its loading in filled glass composites. When the loading becomes too high, the filled glass dielectric composites do not sinter hermetically, and the dielectric is no longer a good insulator because of its open porosity. A filler with improved glass wetting properties would allow higher loadings of low-K filler, reducing the dielectric constant of the composite and increasing its hermeticity.

There are two crystalline forms of silica other than quartz which are stable at ambient pressure, tridymite and cristobalite. Each of these structural forms undergoes a displacive alpha-to-beta phase transition accompanied by an abrupt volume change, and thus suffers from the same mechanical instabilities as quart does. If the high-temperature forms of quartz, tridymite, or cristobalite could be stabilized to room temperature, the stabilized material would not suffer from phase transitions upon heating or cooling. It has been recognized for a number of years that glass-ceramics in which the predominant crystalline phase is stabilized high (beta) cristobalite can be formed by crystallizing a high-silica glass containing other constituents such as $Na_2O$, CaO, and $Al_2O_3$. This approach to forming stabilized high cristobalite glass-ceramics was disclosed by MacDowell (U.S. Pat. No. 3,445,252), who claimed that glass compositions containing 55–90 weight % $SiO_2$, 5–40 weight % $Al_2O_3$, ($SiO_2/Al_2O_3 = 5.0$–7.1) and 1–5 weight % CaO, CuO or SrO crystallized to glass-ceramics with high cristobalite as the primary crystalline phase. Li (U.S. Pat. No. 4,073,655) claimed high cristobalite glass-ceramic articles with improved phase purity by restricting the glass compositions to those containing equimolar ratios of CaO (up to 70 mole % of the CaO can be substituted by other oxides) and $Al_2O_3$.

Kaduk (U.S. Pat. No. 4,395,388) disclosed the formation of stabilized high cristobalite from a high pH solution containing silica and a source of boron oxide which was reacted under hydrothermal conditions in the presence of glycerol. This type of process normally forms low (alpha) cristobalite. Recently, Perrota et al. (U.S. Pat. No. 4,818,729) claimed another wet chemical process for forming stabilized high cristobalite from dried gels containing silica, $Al_2O_3$, and any alkali or alkaline earth oxide, excluding $Li_2O$, BeO, and MgO. They claim, as previously described by Li, that the molar ratio of $Al_2O_3$ to alkali or alkaline earth oxide must be nearly equimolar, i.e. between 0.95 and 1.1, or the high cristobalite phase is not stabilized. They specify that the ratio of silica to $Al_2O_3$ can vary from 10–40 to form the stabilized material. Their process requires calcination at 800°–1400° C. for long times (often greater than 24 hours) to form high cristobalite and yielded material which was contaminated by other phases, such as anorthite. It would be greatly preferred to shorten the required crystallization time so that the synthesis process would be more economical.

The mechanism of the stabilization of high cristobalite is a matter of some controversy. Various workers have proposed that stabilization is achieved by "stuffing" interstices in the cristobalite framework with mono- or divalent cations. These cations are charge-compensated by the substitution of $Al^{3+}$ for $Si^{4+}$ in the framework. Other authors have stated that stabilized cristobalite is formed when crystallization of cristobalite occurs in a glass matrix which constrains the crystalline particles and prevents the inversion to the low-temperature (alpha) form of cristobalite. Finally, other authors have found that stabilization may be achieved by the introduction of defects or stacking faults into the cristobalite structure. These defects may take the forms of tridymite-like intergrowths. It is unclear at this time which, if any, of these mechanisms are operative.

To be useful as a filler in composite dielectrics, a material should have smooth thermal expansion behavior, i.e. it should not undergo any abrupt volume changes up to at least 1000° C., and should have a TCE of about 6-12 ppm/°C. in the range 25°-300° C. The filler must also be stable in the presence of molten glasses, a condition which occurs during firing. Of course, the dielectric constant of the material should be as low as possible, preferably less than about 5, and the dielectric loss should be less than about 0.5% tan d. Finally, the filler powders should have good wetting properties in combination with a variety of glasses, in order to form dense composites at filler loadings of at least 20-60 volume percent. In particular, the wetting properties of the filler should allow larger filler loadings than are possible with quartz. Phase-pure materials are preferable for packaging applications, but materials containing small amounts of impurity phases may also be suitable, so long as the predominant phase has the desired properties and the properties of the impurities are not deleterious.

SUMMARY OF THE INVENTION

The invention is directed to a crystalline composition having an X-ray diffraction pattern essentially the same as the high cristobalite form of silica consisting essentially by mole % of 90-98% $SiO_2$, 2-12% $Al_2O_3$ and 0.5-8% of a metal oxide ($Me_xO$) in which Me is selected from Na, Ca, Sr and mixtures thereof in which composition the ratio of $Me_xO$ to $Al_2O_3$ is 0.2 to 0.9.

DETAILED DESCRIPTION OF THE INVENTION

The stabilized cristobalite powders of this invention are intended primarily for use as fillers in glass composite low-K dielectric systems. They may also be useful in high-temperature structural ceramic or refractory applications where their smooth thermal expansion and thermal stability to >1400° C. are important. Fillers for low-K dielectric applications require low dielectric constants, good chemical durability, and good sintering properties and stability in combination with a variety of glasses. Ideally, the filler material will also not undergo any abrupt volume changes due to phase transitions in the temperature range of multilayer circuit fabrication, namely from about 25° to 950° C. We have found that certain ranges of composition in the $CaO$—$Al_2O_3$—$SiO_2$, $SrO$—$Al_2O_3$—$SiO_2$, and $Na_2O$—$Al_2O_3$—$SiO_2$ systems allow formation of powders with an X-ray powder diffraction pattern at room temperature which is essentially the same as that of the high cristobalite phase of silica. There are no abrupt volume changes in the material upon heating, as in unstabilized cristobalite. The dielectric constant of the stabilized cristobalite of this invention is about 4 which is slightly lower than that of quartz. Therefore, it is useful for low-K electronic packaging.

The stabilization of the high cristobalite-like phase is achieved by addition to silica of appropriate amounts of $Al_2O_3$ and of CaO, $Na_2O$, SrO, or mixtures thereof. Compositions containing alkali and alkaline earth oxides other than those mentioned above, in combination with alumina and silica, do not yield phase-pure high cristobalite. Typically, low cristobalite and other crystalline silicates are formed when constituents other than those specified above are employed. Often, the material contains impurity phases with some amount of high cristobalite. This finding was unexpected, since it is contrary to the teachings of Perotta et al., who claim that any alkali oxide, excluding $Li_2O$, or any alkaline earth oxide, excluding BeO and MgO, may be used in combination with alumina and silica in the correct proportions to yield stabilized high cristobalite. The material may also contain intergrowths of tridymite. These intergrowths do not affect the essential properties of the compositions. Likewise small quantities of other phases can be present without changing the essential properties of the compositions of the invention. It is preferred that the composition of the invention contain no more than 5% by weight of other phases such as anorthite, mullite and glass. The presence of such impurities can be determined by analytical electron microscopy.

The new crystalline compositions in accordance with the invention containing excess alumina (relative to the equimolar ratio of alkali or alkaline earth oxide to alumina) have several important advantages over the previously disclosed equimolar compositions. From the previous teachings of Perotta et al. and others, it would be anticipated that compositions containing excess alumina would not form phase-pure stabilized cristobalite. Nevertheless, it has been found in fact, that the "non-stoichiometric" (excess alumina) stabilized cristobalite powders are more phase-pure from X-ray diffraction than the stoichiometric powders, which are normally contaminated by trace quantities of unstabilized low cristobalite. Low cristobalite is distinguished from high cristobalite in X-ray diffraction patterns by the presence of three reflections at d-values of about 3.5 Å 3.1 Å and 2.8 Å in the diffraction pattern of low cristobalite. The small amount of low cristobalite present in the stoichiometric powders of the prior art causes rather large non-linearities in their thermal expansion behavior, due to the large volume change associated with the alpha-to-beta cristobalite phase transition at about 200°-270° C. Minimizing the amount of low cristobalite impurities by the addition of excess alumina yields powders with essentially linear thermal expansion behavior, a desirable property for multilayer IC packaging since thermal expansion matching between layers is crucial.

The sintering properties of the non-stoichiometric powders in combination with glasses are also superior to those of the stoichiometric powders or of quartz. Of special importance is the observation that in the non-stoichiometric compositions of the invention, crystallization can be achieved much more quickly than in the equimolar compositions. For example, the calcination time required to form the high cristobalite phase in equimolar compositions ($CaO:Al_2O_3:SiO_2$ ratio of 1:1:40) is about 20-24 hours at 1100° C.; material with a $CaO:Al_2O_3:SiO_2$ ratio of 1:2:40 crystallizes in three hours at 1100° C. or in seven hours at 1050° C. Although the compositions of the invention contain non-equimolar ratios of alkali or alkaline earth oxides to aluminum oxide (excess aluminum oxide), they form stabilized cristobalite which is free from any impurities detectable by X-ray diffraction. This finding is in contradiction to the previous teachings of Perotta et al., who teach that a near-equimolar ratio of alkali or alkaline earth oxide to alumina is required to form the stabilized cristobalite phase.

In the powders of the invention the preferred compositions vary depending upon the identity of the the alkali or alkaline earth oxide used. In the $CaO$—$Al_2O_3$—$SiO_2$ system, a material is formed which appears from X-ray powder diffraction to be predominantly high cristobalite when the molar concentration of $SiO_2$ is about 91-96 mole %. Compositions containing more silica will form mixtures of high and low cristobalite, while compositions containing less silica typically contain amorphous or crystalline impurity phases such as anorthite.

The molar ratio of $Al_2O_3$ to CaO is also important. This ratio should be at least one, and can vary up to about 5. Greater concentrations of $Al_2O_3$ (lower concentrations of CaO) inhibit the crystallization of the stabilized cristobalite phase, while lower concentrations of $Al_2O_3$ (greater concentrations of CaO) lead to the formation of large amounts of low cristobalite and/or other impurity phases. The preferred compositions contain about 92-96 mole % $SiO_2$, with $Al_2O_3$/CaO ratios of about 1.5-2.5.

The $SrO-Al_2O_3-SiO_2$ and $Na_2O-Al_2O_3-SiO_2$ systems show behavior similar to that of the $CaO-Al_2O_3-SiO_2$ system, but with slightly different compositional limits. The $Na_2O-Al_2O_3$ system requires a slightly higher dopant concentration than the CaO-based system to form stabilized cristobalite. Compositions containing more silica will form mixtures of high and low-cristobalite, while compositions containing less silica typically contain amorphous or crystalline impurity phases. The ratio of $Al_2O_3$ to $Na_2O$ can vary between about 1 and 3. Greater concentrations of $Al_2O_3$ (lower concentrations of $Na_2O$) than specified inhibit the crystallization of the stabilized cristobalite phase, while lower concentrations of $Al_2O_3$ (greater concentrations of $Na_2O$) than specified lead to the formation of large amounts of low cristobalite and/or other impurity phases. The preferred compositions contain about 90-92 mole % $SiO_2$, with $Al_2O_3$/$Na_2O$ ratios of about 1.2-2.

The SrO-based systems have the same general trends with composition as the other systems, but the composition range which forms predominantly stabilized cristobalite in this system contains 92-96 mole % $SiO_2$, with $Al_2O_3$/SrO ratios of about 1.2-3. Typically the stabilized cristobalite formed within the specified composition regions in the SrO-based system tends to be contaminated by trace amounts of α-cristobalite. For this reason, materials in the $Na_2O-Al_2O_3-SiO_2$ and $CaO-Al_2O_3-SiO_2$ systems are preferred over those in the $SrO-Al_2O_3-SiO_2$ system.

The specified $Na_2O-Al_2O_3-SiO_2$ and $CaO-Al_2O_3-SiO_2$ compositions provide stabilized cristobalite materials with low dielectric constants, relatively high TCEs (about 8-12 ppm/°C.), and, surprisingly, sintering properties in combination with a variety of glasses which are superior to those of quartz or of stabilized cristobalite compositions containing equimolar ratios of alkali or alkaline earth oxides and $Al_2O_3$. In addition, the crystallization kinetics of the non-stoichiometric compositions described here are more rapid than those of the previously disclosed stoichiometric compositions. Composites made with non-stoichiometric stabilized cristobalite and a number of low-K glasses have excellent properties for electronic packaging applications.

In their principal application as dielectrics for electronic devices of various kinds, the crystallized composition of the invention will generally be applied as either a thick film paste or as a green tape, both of which are subsequently fired to effect densification of the solid particles. Such thick film compositions are comprised of finely divided particles of the composition of the invention dispersed in a volatilizable organic medium comprising an organic polymer and a polymeric organic binder dissolved in a non-volatile solvent. In green tape form, finely divided particles of the composition of the invention are dispersed in a matrix of solid organic polymer which is volatilizable upon firing within the range of 800°-950° C.

It will be recognized by those skilled in the ceramics arts that precursors of the various metal oxides can be used as well as the metal oxides themselves in making the composition of the invention. Thus, carboxylates, oxalates, nitrates and other materials which decompose to form the above-referred metal oxides at temperatures in the range of 800° to 950° C. under oxidative firing conditions can be used as well as the oxides.

The particle size of the crystalline compositions of the invention of the metal oxides components of the formulations for making the crystalline material is not per se critical. Ordinarily, the particle size will be chosen in accordance with the method of application. Thus, if the compositions are to be applied by screen printing, they must be sufficiently small to pass through the printing screen and if they are applied as a green tape, they should be no larger than the thickness of the green tape. Crystalline and metal oxide particles on the order of 1-15 microns are preferred.

None of the oxides in the crystalline materials of the invention is reducible when fired under non-oxidizing and/or reducing conditions and they can be fired under neutral and reducing atmospheric conditions as well as in oxidative atmospheres such as air.

TEST PROCEDURES

A. Dielectric Constant and Loss

Ceramic specimens are evaluated using the following procedure. Sample dimensions are measured with a digital gauge capable of measuring 0.0001 cm. Typical ceramic specimens consist of sintered discs of diameter 10 mm and thickness approximately 1 mm. Silver electrodes are applied over the entire parallel surfaces of the sample. Precautions are taken to avoid the presence of electrode material at the edge of the sample.

Dielectric constant measurements are performed with a parallel plate capacitance technique using Hewlett-Packard (P. O. Box 10301, Palo Alto, Calif. 94303-0890) 4274A and 4275A LCR bridges and fixture 16034B (Test Tweezers) according to the procedure described by Subramanian et al. (Phys. Chem. Minerals 16, 741, 1989).

Each capacitance is calculated from an expression derived from data on standard fused silca $CaF_2$, and $SrF_2$ (Subramanian et al., 1989):

$$C_e = (0.019 \ln P/t - 0.043) P$$

where P and t are sample perimeter and thickness in cm. Actual capacitance, from which the dielectric constant is calculated, is obtained by subtracting the calculated edge capacitance from the apparent sample capacitance.

The accuracy of the dielectric constant measurements using the above techniques was determined from a series of measurements on standard fused silica. The values observed in these measurements are 3.836±0.05 for silica compared to 3.826±0.011 from Bussey et al. (IEEE Trans. on Instrumentation and Measurement, Vol. IM-13: 305-311, 1964), 6.814±0.07 for $CaF_2$ compared to 6.799±0.0007 from Andeen et al. (J. Appl. Phys. 42: 2216-2219, 1971), and 6.463±0.09 for $SrF_2$ compared to 6.4655 from Andeen et al. Thus, the accuracy and precision in the measurement of K for samples having areas of 0.05-1.0 $cm^2$ is 0.5-1.5%. The largest errors are probably associated with irregularities in sample geometry. Although the error in dielectric loss (tan d) specified by Hewlett-Packard is ±0.0016-0.0026, in practice the errors associated with the HP4274A and HP4275A LCR bridges are closer to ±0.0004. These bridges measure loss of doped alkaline earth fluorides at levels of 0.002 with error of 5-20% and at levels of 0.0004-0.0005 with errors of 50-100%.

B. Thermal Expansion Behavior

The thermal expansion of filled glass composites was evaluated using standard thermo-mechanical analysis (TMA) equipment. The values for the thermal coefficient of expansion (TCE) are accurate to within about ±0.5 ppm/°C. The apparatus could detect small levels of alpha-cristobalite impurities, due to the large, sharp expansion associated with the alpha-to-beta phase transition at about 150°-270° C. This was particularly useful for samples in which X-ray powder diffraction was unable to detect the presence of trace amounts of α-cristobalite impurities.

Synthesis Procedure

In the examples which follow, the samples were prepared by the method described in co-pending U.S. patent application Ser. No. 07/606,078 filed simultaneously herewith. In particular, a solution of stoichiometrically appropriate quantities of MeO nitrate hydrate and aluminum nitrate hydrate was prepared. The pH was adjusted to 2.5 and to the solution was added a silica sol (Du Pont Ludox AS-40) and the pH was then adjusted to 2. The admixture was reacted in a continuous stir tank with $NH_4OH$ solution to produce a sol or slurry having a pH of 9. The sol or slurry was spray dried at a feed rate of 30 ml/minute with an air inlet temperature of 320° C. and an outlet temperature of 180° C. to form spherical particles having a surface area of about 80 $m^2/g$ and an average particle size of 6.9 μm. The resultant particles were then calcined as described in the examples.

Units

In the following examples, compositions are given in mole % unless it is expressly stated otherwise.

EXAMPLES

Examples 1-15 ($CaO$—$Al_2O_3$—$SiO_2$ System))

A series of fifteen samples from the $CaO$—$Al_2O_3$—$SiO_2$ system was prepared in the manner described hereinabove. The composition of the samples lay in the $SiO_2$-rich corner of the $CaO$—$Al_2O_3$—$SiO_2$ ternary phase diagram and included compositions containing 90-98% $SiO_2$, 0-10% $Al_2O_3$ and 0-5% $CaO$. The samples were then calcined at 1100° C. for 24 hours. If the samples did not fully crystallize after this treatment, fresh samples of the dried powder were heated at 1225° C. for 24 hours. The phases observed in the X-ray patterns of these materials are reported below. The following abbreviations were used: "β" for stabilized cristobalite structure, "α" for α-cristobalite, "am." for amorphous phase, "an." for anorthite, and "?" for unidentified crystalline impurities. Phases in parentheses were present in only trace amounts.

TABLE I

| | Phases Formed in $CaO$—$Al_2O_3$—$SiO_2$ System | | | | | | | | | | | | | | |
|---|---|---|---|---|---|---|---|---|---|---|---|---|---|---|---|
| | Example | | | | | | | | | | | | | | |
| | 1 | 2 | 3 | 4 | 5 | 6 | 7 | 8 | 9 | 10 | 11 | 12 | 13 | 14 | 15 |
| Mole % CaO | 0 | 1.2 | 1.4 | 1.9 | 2.3 | 2.3 | 2.4 | 2.4 | 4.5 | 4.6 | 0.7 | 1.8 | 2.3 | 1.2 | 1.9 |
| Mole % $Al_2O_3$ | 4.8 | 1.2 | 1.4 | 1.9 | 4.6 | 6.8 | 2.4 | 3.5 | 4.5 | 2.4 | 3.4 | 7.3 | 5.7 | 4.7 | 2.1 |
| Mole % $SiO_2$ | 95.2 | 97.6 | 97.2 | 96.2 | 93.1 | 90.9 | 95.2 | 94.1 | 91.0 | 93.0 | 95.9 | 90.9 | 91.9 | 94.1 | 96.0 |
| Phases Formed | am. | β, α | β, (α) | β | β | β, am. | β | β | β, an. | β, ? | β, α | β, (α) | β | β, (?) | β, am. |

These results indicate that materials in which the X-ray powder diffraction pattern is predominantly identical to that of high cristobalite, i.e. no impurity diffraction peaks with intensities greater than about 3% of that of the most intense peak of high cristobalite, are those with the following compositions: 90-98 mole % $SiO_2$, with $CaO/Al_2O_3$=0.2-1.0 (mole ratio). The most phase-pure stabilized cristobalite materials are those with the following compositions: 92-96 mole % $SiO_2$, $CaO/Al_2O_3$=0.4-0.7 (mole ratio).

Examples 16-28 ($Na_2O$—$Al_2O_3$—$SiO_2$ System)

Samples were synthesized in the $SiO_2$-rich corner of the $Na_2O$—$Al_2O_3$—$SiO_2$ ternary phase diagram, using the process described herein above, and covering compositions from about 85-98 mole % $SiO_2$, 0-10 mole % $Al_2O_3$, and 0-10 mole % $Na_2O$. The samples were then calcined at 1100° C. for 24 hours. Samples which did not fully crystallize after this treatment were treated at 1225° C. for 24 hours. The phases observed in the X-ray patterns of these materials are reported below.

TABLE II

| | Phases Formed in $Na_2O$—$Al_2O_3$—$SiO_2$ System | | | | | | | | | | | | |
|---|---|---|---|---|---|---|---|---|---|---|---|---|---|
| | Example | | | | | | | | | | | | |
| | 16 | 17 | 18 | 19 | 20 | 21 | 22 | 23 | 24 | 25 | 26 | 27 | 28 |
| Mole % $Na_2O$ | 2.4 | 4.5 | 4.3 | 3.7 | 5.9 | 3.0 | 6.1 | 0.6 | 2.3 | 0.6 | 1.2 | 1.9 | 3.1 |
| Mole % $Al_2O_3$ | 2.4 | 4.5 | 8.7 | 3.7 | 5.9 | 6.1 | 3.0 | 4.0 | 3.0 | 1.5 | 3.1 | 5.0 | 3.8 |
| Mole % $SiO_2$ | 95.2 | 90.9 | 87.0 | 92.6 | 88.2 | 90.9 | 90.9 | 95.4 | 94.7 | 97.9 | 95.7 | 93.1 | 93.1 |
| Phases Formed | β, α, am. | β, am | am., (β) | β | am., β | am., β | ?, α | am., β, α | β, am. | α | α, am. | α, am. | am. (α) |

These results indicate that materials in which the X-ray powder diffraction pattern is predominantly identical to that of high cristobalite, i.e. no impurity diffraction peaks with intensities greater than about 3% of those of the most intense peak of high cristobalite, are those with the following compositions: 89-93 mole % $SiO_2$, $Na_2O/Al_2O_3$=0.5-1.0 (mole ratio). The most phase-pure stabilized cristobalite materials are those with the following compositions: 90-92 mole % $SiO_2$, $Na_3O/Al_2O_3$=0.5-1.0 (mole ratio).

Examples 29-34 (SrO—Al$_2$O$_3$—SiO$_2$ System)

Samples were synthesized in the SiO$_2$-rich corner of the SrO—Al$_2$O$_3$—SiO$_2$ ternary phase diagram, using the process described in herein above, and covering compositions from about 89-98 mole % SiO$_2$, 0-10 mole % Al$_2$O$_3$, and 0-5% SrO. The samples were then calcined at 1100° C. for 24 hours. Samples which did not fully crystallize after this treatment were treated at 1225° C. for 24 hours. The phases observed in the X-ray patterns of these materials are reported below.

TABLE III

Phases Formed in SrO—Al$_2$O$_3$—SiO$_2$ System

| | Example | | | | | |
|---|---|---|---|---|---|---|
| | 29 | 30 | 31 | 32 | 33 | 34 |
| Mole % SrO | 2.3 | 2.4 | 3.0 | 4.5 | 1.2 | 3.7 |
| Mole % Al$_2$O$_3$ | 4.7 | 2.4 | 6.1 | 4.5 | 5.8 | 7.3 |
| Mole % SiO$_2$ | 93.0 | 95.2 | 90.9 | 90.9 | 93.0 | 89.0 |
| Phases Formed | β, (α) | β, α, ? | β, (α) | β, ? | α | β, am. |

These results indicate that materials in which the X-ray powder diffraction pattern is predominantly identical to that of high cristobalite, i.e. no impurity diffraction peaks with intensities greater than about 5% of the most intense peak of high cristobalite, are those with the following compositions: 91-95 mole % SiO$_2$, CaO/Al$_2$O$_3$=0.3-1 (mole ratio). Truly phase-pure stabilized cristobalite materials are not formed in this system using the above-mentioned synthesis procedure.

Examples 35-37 (Effects of Other Dopant Ions)

We have found that alkali and alkaline earth oxides other than CaO, SrO, and Na$_2$O are not effective in stabilizing materials with a diffraction pattern nominally identical to that of the high cristobalite phase of silica to room temperature. This was unexpected, based on the previous teachings of Perotta et al, who claim that any alkali oxide, excluding Li$_2$O, or any alkaline earth oxide, excluding BeO and MgO, may be used in combination with alumina and silica in the correct proportions to yield stabilized high cristobalite. These samples were calcined in the same manner as the previous examples.

TABLE IV

Phases Formed in other MeO (or Me$_2$O)—Al$_2$O$_3$—SiO$_2$ Systems

| Example 35 | | Example 36 | | Example 37 | |
|---|---|---|---|---|---|
| Mole % BaO | 2.4% | Mole % K$_2$O | 2.4% | Mole % K$_2$O | 4.5% |
| Mole % Al$_2$O$_3$ | 4.5% | Mole % Al$_2$O$_3$ | 2.4 | Mole % Al$_2$O$_3$ | 4.5 |
| Mole % SiO$_2$ | 95.2 | Mole % SiO$_2$ | 95.2 | Mole % SiO$_2$ | 91.0 |
| Phases Formed | α, ? | Phases Formed | α, ? | Phases Formed | am. |

The samples containing BaO crystallized to a mixture of low cristobalite and impurity phases. The samples containing K$_2$O formed predominantly low cristobalite with some impurity phases or did not crystallize at all after the annealing treatments employed.

Examples 38-41 (Crystallization Kinetics)

Four further samples were prepared using the process described in Example 1 to study the effects off composition on crystallization kinetics. We have unexpectedly found that materials containing excess alumina (relative to the equimolar ratio of alkali or alkaline earth oxide to alumina) have significantly faster crystallization kinetics than materials with the previously disclosed stoichiometric compositions. Below, the ratios of the X-ray intensity (I$_c$) of the largest stabilized cristobalite peak at about 2θ=21.6° minus any amorphous background to the X-ray intensity of the amorphous background (I$_{am}$) at that same 2θ value are given for four samples in the CaO—Al$_2$O$_3$—SiO$_2$ system annealed at 1050° C. for seven hours. The ratio I$_c$/I$_m$ is a rough indicator of the relative degree of crystallization in the samples.

TABLE V

| | Example | | | |
|---|---|---|---|---|
| | 38 | 39 | 40 | 41 |
| Mole % CaO | 2.4 | 2.4 | 2.3 | 2.3 |
| Mole % Al$_2$O$_3$ | 2.4 | 3.5 | 4.7 | 5.7 |
| Mole % SiO$_2$ | 95.2 | 94.1 | 93.0 | 92.0 |
| I$_c$/I$_{am}$ | 1.4 | 8.6 | >500 | 20.9 |

Samples containing excess alumina (Examples 39-41) clearly crystallize more quickly than stoichiometric samples (Example 38). The fastest crystallization kinetics are found in samples with CaO/Al$_2$O$_3$ molar ratios of about 0.5 (Example 40). The same general trends in crystallization kinetics with composition are found at temperatures above and below 1050° C., the temperature employed for these Examples. Since shorter crystallization times at a given temperature are needed to form the stabilized cristobalite structure in compositions containing excess alumina, their synthesis is more economical than that of the previously disclosed stoichiometric compositions.

Examples 42-45 (Comparison of Dielectric Properties of Filled Glass Composites Containing Quartz and Stabilized Cristobalite)

Dielectric compositions were formulated by admixing finely divided amorphous crystallizable glass particles and/or amorphous borosilicate glass particles and a silica filler (either quartz or stabilized cristobalite). The glass particles were made by mixing appropriate amounts of the glass components, heating the mixture to form a homogeneous melt, dry quenching the resultant glass through cooled rollers, and then dry milling the glass flakes into fine particles.

Casting solutions were formulated by dispersing the dielectric composition in a binder/plasticizer matrix in a volatile non-aqueous solvent in a ball mill. An acrylic binder plasticizer matrix of the type disclosed by Usala in U.S. Pat. No. 4,613,648 was used. Specifically, the binder comprised 30% by weight terpolymer of 62.3% by weight ethyl methacrylate, 37.1% by weight methyl methacrylate; 50% by weight 1,1,1 trichloroethane; and 20% by weight methyl ethyl ketone. Dioctyl pthalate was the plasticizer and the binder/plasticizer matrix comprised binder to plasticizer in a weight ratio of about 4.5 to 5. The solvent contained the following components in the following amounts by weight:

| | |
|---|---|
| 1,1,1-Trichlorethane | 70-85% |
| Methylene Chloride | 2-7% |
| Methyl Ethyl Ketone | 4-11% |
| Isopropanol | 2-6% |
| 1,1,2-Trichloro-1,2,2- | 4-10% |

-continued trifluoroethane preparing polished cross-sections of the fired parts for scanning electron microscopy (SEM). The formulations of these parts are given below.

TABLE VII

|  | Example | | | | | | | | |
|---|---|---|---|---|---|---|---|---|---|
|  | 46 | 47 | 48 | 49 | 50 | 51 | 52 | 53 | 54 |
| Weight % CGW 7070 | 60% | 60% | 60% | 50% | 50% | 50% | 40% | 40% | 40% |
| Weight % Quartz | 40 | — | — | 50 | — | — | 60 | — | — |
| Weight % Stoichiometric Cristobalite (Example #7) | — | 40 | — | — | 50 | — | — | 60 | — |
| Weight % Non-Stoichiometric Cristobalite (Example #5) | — | — | 40 | — | — | 50 | — | — | 60 |

The dispersions were achieved by mixing for 6-10 hours. The solutions were formed into tapes by casting onto a silicone-coated polyester film at 60° C. The thickness of the cast tapes varied between about 4.1 and 10 mils. Samples were fabricated into a substrate geometry by laminating 8 sheets together by means of a confined pressing die operated at 70° C. for 20 minutes under 3000 psi. One inch by one inch laminated parts were preheated at a rate of 5° C./minute in air and held at 450° C. for one hour to remove the organic binders. After binder burn-out, the parts were fired at 900° C. for 60 minutes.

Dielectric parts were fabricated from mixtures of a borosilicate glass (CGW 7070, Corning Glass Works, Corning, N.Y.), cordierite glass, and either quartz or stabilized cristobalite. The composition disclosed here as Example 44 was designed to have a thermal expansion coefficient matched to that of silicon, while that of Example 42 was designed to have a thermal expansion coefficient matched to that of alumina. The formulations (based on the weight percent solids) and dielectric properties of fired tapes of these compositions are described below.

TABLE VI

|  | Example | | | |
|---|---|---|---|---|
|  | 42 | 43 | 44 | 45 |
| Weight % CGW 7070 | 50% | 50% | 30% | 30% |
| Weight % Cordierite Glass | 25 | 25 | 57 | 57 |
| Weight % Quartz | 25 |  | 13 |  |
| Weight % Cristobalite (Example #5) |  | 25 |  | 13 |
| Dielectric Constant | 4.5 | 4.8 | 4.5 | 4.4 |
| Dielectric Loss | 0.3% | 0.5% | 0.3% | 0.7% |

The dielectric properties of the tapes made with quartz are very similar to those of the tapes made with stabilized cristobalite. From the known dielectric properties and densities of the other components of the tapes, the dielectric constant of the stabilized cristobalite is estimated to be about 4.

Examples 46-54 (Comparison of Microstructures of Filled Glass Composites Containing Quartz, Stoichiometric Cristobalite, or Non-Stoichiometric Cristobalite)

Nine further tapes were made with various amounts of a borosilicate glass (CGW 7070) and either quartz or stoichiometric stabilized cristobalite (of the composition described in Example 7) or non-stoichiometric cristobalite (of the composition described in Example 5), using the formulation process described in Examples 42-45. The microstructures of fired eight-layer laminated parts made from these tapes were examined by preparing polished cross-sections of the fired parts for scanning electron microscopy (SEM). The formulations of these parts are given below.

Sintered density is important parameter for dielectric systems used in ceramic electronic packaging. Parts with denser microstructures tend to have better insulating properties and are mechanically stronger. Typically, the filler loading which can be practically employed in a filled glass composite is limited by the wetting properties of the filler. When the filler loading is increased, the porosity of the parts also increases because the glass is unable to flow between all of the filler particles during processing. However, comparison of SEM photographs of the microstructures of the fired tapes indicated that the parts containing non-stoichiometric stabilized cristobalite have significantly less porosity than equivalent parts containing quartz or stoichiometric stabilized cristobalite for a given filler/glass ratio. The parts containing stoichiometric stabilized cristobalite are slightly less porous than those containing quartz. The differences in the fired density of the filled glass composites is due to the superior wetting properties of the non-stoichiometric stabilized cristobalite material over those of quartz or stoichiometric stabilized cristobalite.

Examples 55 and 56 (Comparison of Thermal Expansion Properties of Stoichiometric and Non-Stoichiometric Stabilized Cristobalite)

Two further tapes were formulated using the process described in Examples 42-45 to illustrate the superior thermal expansion properties and phase purity of the non-stoichiometric stabilized cristobalite, as compared to the previously disclosed stoichiometric material. The mechanical integrity and materials compatibility of multilayer electronic packaging systems are often controlled by the thermal expansion matching between the various layers. It is thus extremely important that the dielectric layers have smooth thermal expansion behavior, or cracking and delamination between these layers and other layers, such as alumina substrates or silicon chips, may result during circuit fabrication. We have found that, surprisingly, the expansion properties of non-stoichiometric stabilized cristobalite (containing excess alumina) are considerably more linear than those of the previously disclosed stoichiometric compositions. This can be illustrated by analyzing the thermal expansion of glass composite tapes made with the two materials, as shown below.

TABLE VIII

|  | Example | |
|---|---|---|
|  | 55 | 56 |
| Weight % CGW 7070 | 50% | 50% |
| Weight % Cordierite Glass | 25 | 25 |
| Weight % Stoichiometric Cristobalite (Example #7) | 25 |  |

TABLE VIII-continued

| | Example | |
|---|---|---|
| | 55 | 56 |
| Weight % Non-Stoichiometric Cristobalite (Example #5) | | 25 |
| TCE (ppm/°C.), 25-200° C. | 10.7 | 4.7 |
| TCE (ppm/°C.), 200-600° C. | 4.8 | 4.7 |
| Average TCE (ppm/°C.), 25-600° C. | 6.6 | 4.7 |

The tape made with non-stoichiometric stabilized cristobalite has a thermal expansion coefficient which does not vary appreciably over the range studied, 25°-600° C. From the known TCEs and densities of the other components of the tape, the TCE of non-stoichiometric stabilized cristobalite is estimated to be about 10-12 ppm/°C. The tape made with stoichiometric stabilized cristobalite, on the other hand, has a much higher TCE at lower temperatures than it does at higher temperatures. The higher TCEs at low temperature are probably due to the presence of trace amounts of low cristobalite in these samples which were not detected by X-ray diffraction. Low cristobalite has a relatively high TCE, and undergoes a phase transition to high cristobalite at a temperature which can vary between about 150°-270° C., depending on the exact composition and thermal history of the low cristobalite. This phase transition is accompanied by a large volume expansion. Once all of the low cristobalite has transformed into high cristobalite (at temperatures greater than about 200° C.), the TCEs of the non-stoichiometric and stoichiometric samples are essentially the same. The addition of excess alumina to the compositions thus yields samples with less α-cristobalite than the previously disclosed stoichiometric compositions, and leads to composite parts with more linear thermal expansion behavior over the full temperature range of interest.

Examples 57-62 (Comparison of Dissolution Properties of Quartz and Chemically Stabilized Cristobalite)

One important consideration in the choice of a filler for glass composite applications is the stability of the filler under the firing conditions employed. Chemical reactions, including dissolution of the filler, can occur when the composites are fired. Since multiple firings are often needed to build up multilayer packages, the properties of the composites system can change during processing, a highly undesirable situation. We have examined the relative stability of quartz and chemically stabilized cristobalite in the presence of a borosilicate glass (Corning 7070) at 950° C., a typical temperature used in the processing of multilayer electronic packages. Pellets containing 50 weight % of Corning 7070 glass and 50 weight % of quartz or chemically stabilized cristobalite were prepared by pressing powders mixed by ball-milling. These powders were fired at 950° C. for the times indicated, and then ground for analysis by X-ray diffraction. The results of these experiments are summarized in Table IX; the phases are listed in the order of the X-ray intensity of the most intense peak in the diffraction pattern of each crystalline phase indicated. Each diffraction pattern also has significant amorphous background, due to the presence of the Corning 7070 glass. Phase indicated within parentheses were present in trace amounts only.

TABLE IX

| Phases Present After Firing at 950° C. | | | | | | |
|---|---|---|---|---|---|---|
| | Example | | | | | |
| | 57 | 58 | 59 | 60 | 61 | 62 |
| Weight % CGW 7070 | 50% | 50% | 50% | 50% | 50% | 50% |
| Weight % Quartz | 50 | | 50 | | 50 | |
| Weight % Non-Stoichiometric Cristobalite (Example #5) | | 50 | | 50 | | 50 |
| Firing Time at 950° C. (hours) | 0.25 | 0.25 | 2 | 2 | 66 | 66 |
| Phases Present | α | β | Q, α | β | α, Q | β, (α) |

The phases present in the pellets formulates with quartz change dramatically with firing time. Apparently, the quartz slowly reacts to form α-cristobalite during firing at 950° C. in the presence of Corning 7070 glass. Some of the quartz may also dissolve into the glassy phase, but it is not possible to quantitatively determine the amount of dissolution from X-ray diffraction. It has been reported that quartz transforms into the tridymite phase of silica at 864° C., so it is not surprising that quartz is unstable at 950° C. It is however, somewhat surprising that cristobalite, rather than trydimite, is the reaction product.

The pellets containing chemically stabilized cristobalite are much more stable to prolonged firing at 950° C. After 66 hours at 950° C., a time much longer than the cumulative time needed to produce any multilayer package, the only change in the X-ray diffraction pattern of the pellets is the appearance of trace amounts of low-cristobalite. Since quartz reacts to form low-cristobalite, cristobalite appears to be the stable form of silica under these firing conditions. Since chemically stabilized cristobalite has superior chemical stability to quartz, it is a better filler for glass composite applications where high-temperature (>800° C.) processing steps are employed.

We claim:

1. A stabilized crystalline composition having an X-ray diffraction pattern essentially the same as the high cristobalite form of silica consisting essentially on a molar basis of 90-98% $SiO_2$, $Al_2O_3$ and a metal oxide ($Me_xO$) in which Me is selected from Na, Ca, Sr and mixtures thereof, the ratio of $Me_xO$ to $Al_2O_3$ being 0.2-0.9.

2. The composition of claim 1 which contains 91-96% $SiO_2$, Me is Ca, and the ratio of CaO to $Al_2O_3$ is 0.4-0.7.

3. The composition of claim 1 which contains 90-92% $SiO_2$, Me is Na, and the ratio of $Na_2O$ to $Al_2O_3$ is 0.5-0.8.

4. The composition of claim 1 which contains 92-96% $SiO_2$, Me is Sr, and the ratio of SrO to $Al_2O_3$ is 0.3-0.8.

5. A screen-printable thick film composition comprising finely divided particles of the composition of claim 1 dispersed in a volatilizable organic medium.

6. A green tape comprising a film of finely divided particles of the composition of claim 1 dispersed in a matrix of solid volatilizable organic polymer.

* * * * *

UNITED STATES PATENT AND TRADEMARK OFFICE
CERTIFICATE OF CORRECTION

PATENT NO.  : 5,096,857
DATED       : March 17, 1992
INVENTOR(S) : Yung-Haw Hu and Michael A. Saltzberg It is certified that error appears in the above-identified patent and that said Letters Patent is hereby corrected as shown below:

On title page, item [75]:
  On front page, Inventors:  Yung-Haw Hu, Wilmington, Del.;
                             Michael A. Saltzeberg, Glen Mills, Pa.

should be replaced with:

-- Inventors:  Yung-Haw Hu, Wilmington, Del.;
                       Michael A. Saltzberg, Glen Mills, Pa. --

Signed and Sealed this

Twenty-second Day of June, 1993

Attest:

MICHAEL K. KIRK

*Attesting Officer*            *Acting Commissioner of Patents and Trademarks*